US007763362B2

(12) United States Patent
Jablonski et al.

(10) Patent No.: US 7,763,362 B2
(45) Date of Patent: Jul. 27, 2010

(54) SHIELDING BASED ON METALLIC NANOPARTICLE COMPOSITIONS AND DEVICES AND METHODS THEREOF

(75) Inventors: Gregory A Jablonski, Yardley, PA (US); Michael A Mastropietro, Bridgewater, NJ (US); Christopher J. Wargo, Somerset, NJ (US)

(73) Assignee: PChem Associates, Inc., Bensalem, PA (US)

( * ) Notice: Subject to any disclaimer, the term of this patent is extended or adjusted under 35 U.S.C. 154(b) by 210 days.

(21) Appl. No.: 12/039,896

(22) Filed: Feb. 29, 2008

(65) Prior Publication Data

US 2008/0213609 A1 Sep. 4, 2008

Related U.S. Application Data

(60) Provisional application No. 60/892,407, filed on Mar. 1, 2007.

(51) Int. Cl.
*B22F 3/00* (2006.01)
*B22F 7/04* (2006.01)
*B32B 5/16* (2006.01)
*B32B 15/04* (2006.01)
*B32B 15/16* (2006.01)

(52) U.S. Cl. ........................ 428/546; 428/566; 428/623; 428/457; 427/190; 427/191; 427/375; 427/383.1

(58) Field of Classification Search ........................ None
See application file for complete search history.

(56) References Cited

U.S. PATENT DOCUMENTS

| 4,599,277 A | 7/1986 | Brownlow et al. |
| 5,071,826 A | 12/1991 | Anderson et al. |
| 5,332,646 A | 7/1994 | Wright et al. |
| 5,338,507 A | 8/1994 | Anderson et al. |
| 5,455,749 A | 10/1995 | Ferber |
| 5,973,420 A | 10/1999 | Kaiserman et al. |
| 6,036,889 A | 3/2000 | Kydd |
| 6,103,868 A | 8/2000 | Heath et al. |
| 6,379,745 B1 | 4/2002 | Kydd et al. |
| 6,645,444 B2 | 11/2003 | Goldstein |
| 6,773,926 B1 | 8/2004 | Freund et al. |
| 6,830,778 B1 | 12/2004 | Schulz et al. |

(Continued)

FOREIGN PATENT DOCUMENTS

JP   2003308499   10/2003

(Continued)

OTHER PUBLICATIONS

ASM Handbook vol. 07: Powder Metal Technologies and Applications, eds. Eisen, W.B. et al., American Society of Metals, 1998, 360-361.

(Continued)

*Primary Examiner*—Jennifer C McNeil
*Assistant Examiner*—Jason L Savage
(74) *Attorney, Agent, or Firm*—Woodcock Washburn, LLP

(57) ABSTRACT

Disclosed are cohesive metallic structures, comprising sintered metallic nanoparticles, suitable for shielding against electromagnetic interference and radio frequency interference. Also disclosed are methods for forming such structures. Devices for shielding electromagnetic radiation and methods of shielding electromagnetic radiation using such devices are also provided.

50 Claims, 3 Drawing Sheets

U.S. PATENT DOCUMENTS

| | | | |
|---|---|---|---|
| 6,855,378 B1 | 2/2005 | Narang | |
| 6,872,645 B2 | 3/2005 | Duan et al. | |
| 6,878,184 B1 | 4/2005 | Rockenberger et al. | |
| 6,951,666 B2 | 10/2005 | Kodas et al. | |
| 7,115,218 B2 | 10/2006 | Kydd et al. | |
| 7,211,439 B2 * | 5/2007 | Vossmeyer et al. | 436/151 |
| 2002/0197390 A1 * | 12/2002 | Lewis et al. | 427/2.13 |
| 2004/0004209 A1 * | 1/2004 | Matsuba et al. | 252/518.1 |
| 2004/0151893 A1 | 8/2004 | Kydd et al. | |
| 2005/0078158 A1 | 4/2005 | Magdassi et al. | |
| 2005/0126338 A1 | 6/2005 | Yadav | |
| 2005/0235869 A1 * | 10/2005 | Cruchon-Dupeyrat et al. | 106/31.29 |
| 2006/0001726 A1 | 1/2006 | Kodas et al. | |
| 2006/0034731 A1 * | 2/2006 | Lewis et al. | 422/88 |
| 2006/0044382 A1 | 3/2006 | Guan et al. | |
| 2006/0163744 A1 | 7/2006 | Vanheusden et al. | |
| 2006/0189113 A1 | 8/2006 | Vanheusden et al. | |
| 2007/0034833 A1 | 2/2007 | Parce et al. | |
| 2007/0154634 A1 * | 7/2007 | Renn | 427/180 |

FOREIGN PATENT DOCUMENTS

| | | |
|---|---|---|
| JP | 2003309337 | 10/2003 |
| JP | 2003309352 | 10/2003 |

OTHER PUBLICATIONS

Curtis, A.C. et al., "A Morphology-Selective Copper Organosol", Agnew. Chem. Int. Ed. Engl., 1988, 27(11), 1530-1533.

Curtis, C. et al., "Metallizations by Direct-Write Inkjet Printing", Conf. Paper NREL/CP-520-31020, NCPV Program review meeting Oct. 14-17, 2001, Lakewood, Colorado, 6 pages.

Curtis, C.J. et al., "Multi-Layer Inkjet printed Contacts for Silicon Solar Cells", Conf. paper NREL/CP-520-39902, 2006 IEEE 4th World Conf. on Photovoltaic Energy Conversion (WPEC-4), May 7-12, 2006, Waikoloa, HAwaii, 5 pages.

Esumi, K. et al., "Role of Poly(amidoamine) Dendrimers for Preparing Nanoparticles of Gold, Platinum, and Silver", Langmuir, 2000, 16, 2604-2608.

Fuller, S.B. et al., "Ink-Jet Printed Nanoparticle Microelectromechanical Systems", Journal of Microelectromechanical Systems, Feb. 2002, 11(1), 54-60.

Hirai, H. et al., "Preparation of Nonaqueous Dispersion of Colloidal Silver by Phase Transfer", Chemistry Letters, 1992, 1527-1530.

Hirai, H. et al., "Preparation of Stable Dispersions of Colloidal Gold in Hexanes by Phase Transfer", Journal of Colooid and Interface Sci., 1993, 161, 471-474.

Kamyshny, A. et al., "Ink-Jet Printing of Mettalic Nanoparticles and Microemulsions", Macromolecular Rapid Communications, 2005, 26, 281-288.

Kaydanova, T. et al., "Direct-Write Contacts for Solar Cells", Conf. paper NREL/CP-520-37080, 2004v DOE Solar Energy Technologies Program Review Meeting, Jan. 2005, 4 pages.

Kaydanova, T. et al., Ink Jet Printing Approaches to Solar Cell Contacts, Conf Paper NREL-CP-520-33594, National Center for Photovoltaics and Solar Program review Meeting, May 2003, 6 pages.

Lee, et al., "Direct Synthesis and Bonding Origins of Monolayer-Protected Silver Nanocrystals from ilver Nitrate through In-Situ Ligand Exchange", J. of Colloid and Interface Sci., 2006, 304, 92-97.

Lee, K.J. et al., Direct Synthesis and Inkjetting of Silver Nanocrystals toward Printed Electronics, Nanotechnology, 2006, 17, 2424-2428.

Manshausen, P. "Role and Function fo Rheological Additives in Modern Emulsion and Industrial Coatings", Borchers GmbH, Monheim, Germany, Presented at the 6th Nurnberg Congress, Apr. 2001, 8 pages.

Porter, Jr., L.A. et al., "Gold and Silver Nanoparticles Functionalized by the Adsorption of Dialkyl Disulfides", Langmuir, 1998, 14, 7378-7386.

Richardson, J.T., Principles of Catalyst Development, Plenum Press, New York, NY, 1989, 29.

Sumitomo Metal Mining Co., Ltd. (Japan), "Conductive paint (Silver-colloidal Paste) for Electrode formation/Under Development", 2001, available online at www.smm.co.jp/b_info_E_b10_E.html.

Trimm, D.L., design of Industrial Catalysts, Elsevier Scientific Publishing Co., Amsterdam, 1980, 107.

Wang, W. et al., "Directing Silver Nanoparticle into Colloid-Surfactant Lyotropic Lamellar Systems", Journal of Physical Chem. B., 1999, 103(27), 5613-5621.

Wang, W. et al., "Directing Oleate Stabilized Nonosized Silver Colloids into Organic Phases", Langmuir, 1998, 14, 602-610.

Wang, W. et al., "Silver Nanoparticles Capped by Long-Chain Unsaturated Carboxylates", J. Phys. Chem. B., 1999, 103, 7238-7246.

Yamamoto, M. et al., New Type of Monodispersed Gold Nanoparticles Capped by Myristate and PPh3 Ligands Prepared by Controlled Thermolysis of [Au(C13H27COO)(PPh3)] chem Letters, 2003, 32(5), 452-453.

Yamamoto, M. et al., "Size-Controlled Synthesis of Monodispersed Silver Nanoparticles capped by long-Chain Alkyl Carboxylates from Silver Carboxylate and Tertiary Amine", Langmuir, 2006, 22, 8581-8586.

Yi, K.C. et al., "chemical Formation of Silver Particulate Films under Monolayers", J. Phys. Chem. B., 1994, 98, 3872-3881.

* cited by examiner

SHIELDING BASED ON METALLIC NANOPARTICLE COMPOSITIONS AND DEVICES AND METHODS THEREOF

CROSS-REFERENCE TO RELATED APPLICATIONS

This application claims benefit to Application No. 60/892,407, filed Mar. 1, 2007, "SHIELDING BASED ON METALLIC NANOPARTICLE COMPOSITIONS," the entirety of which is incorporated herein by reference.

FIELD OF THE INVENTION

The present invention pertains to the field of nanoparticles. The present invention also pertains to the fields of electromagnetic interference shielding and radio frequency interference shielding.

BACKGROUND OF THE INVENTION

The unique properties of metallic nanoparticles make them candidates for various applications where metal flake is currently being utilized. Metal flakes establish a conductive pathway by incidental contact, a relatively inefficient process because the points of contact are inherently highly resistive, essentially acting as an impurity in the system.

Electromagnetic interference ("EMI") and radio frequency interference ("RFI") shielding are two commercial applications that incorporate the use of highly conductive shielding materials. In such applications, shielding material is typically sprayed onto the inside of the plastic housing of devices such as mobile phones.

Presently, metal flake is currently used as the conductive constituent in shielding materials. In some methods, metal flake is formulated with adhesion promoters and other additives in an organic solvent. Some commercially available metal flake formulations include organic solvents.

When metal flake is processed—typically under comparatively high-temperature conditions—the flakes coalesce into a rough conductive network that may be used for shielding. Metal flake networks, however, are not perfectly continuous.

Furthermore, metal flake can not be sintered to form a metallic network shield, and the comparatively high temperature conditions required to form metal flake network shields limits the range of substrates on which such shields can be formed. In addition, organic solvent metal flake systems are not optimal for some applications because of the difficulties inherent in handling of the organic solvents used in metal flake formulations.

Moreover, formation of metal flake shield structures can require several minutes of processing time.

Accordingly, there is a need for a method for forming continuous, highly-conductive metallic structures capable of shielding electronic equipment from EMI and RFI, where such method allows rapid formation of such structures under moderate processing conditions, such as sintering, while minimizing the use of metal and of solvent. There is also a related need for a composition capable of forming such structures under such moderate processing conditions so as to enable formation of shielding structures on substrates unable to tolerate the harsh processing conditions associated with metal flake shielding systems.

SUMMARY OF THE INVENTION

In overcoming the challenges associated with providing a metallic shielding structure that uses a minimal of metal and is capable of forming a cohesive shielding structure under moderate temperature conditions, the present invention provides, inter alia, a cohesive metallic shielding structure, comprising: a population of metallic nanoparticles deposited on a substrate and sintered to form a cohesive metallic shielding structure, wherein the cohesive metallic shielding structure has a characteristic thickness of less than about 20 micrometers; and wherein the cohesive metallic shielding structure has a sheet resistance less than about 50 mohms/square/mil.

In another aspect, the present invention provides a method for forming a cohesive metallic shielding structure on a substrate, comprising: depositing a composition comprising a population of metallic nanoparticles dispersed in an aqueous medium onto the substrate, wherein at least a portion of the population of metallic nanoparticles comprise individual metallic nanoparticles characterized as having an average cross-sectional dimension in the range of from about 1 nm to about 100 nm; and wherein each of the nanoparticles comprise at least one ligand bound to its surface, the ligand comprising a heteroatom head group bound to the nanoparticle surface and a tail bound to the heteroatom head group; and curing the composition at a temperature of less than about 140° C. so as to give rise to a cohesive metallic shielding structure having a sheet resistance of less than about 50 mohms/square/mil.

The present invention also provides devices, comprising a population of metallic nanoparticles deposited on a substrate and sintered to form a cohesive metallic shielding structure, the cohesive metallic shielding structure characterized as having a thickness of less than about 20 micrometers and a sheet resistance less than about 50 mohms/square/mil. Uses of such devices for shielding electromagnetic radiation are also provided.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

Figure 1A:
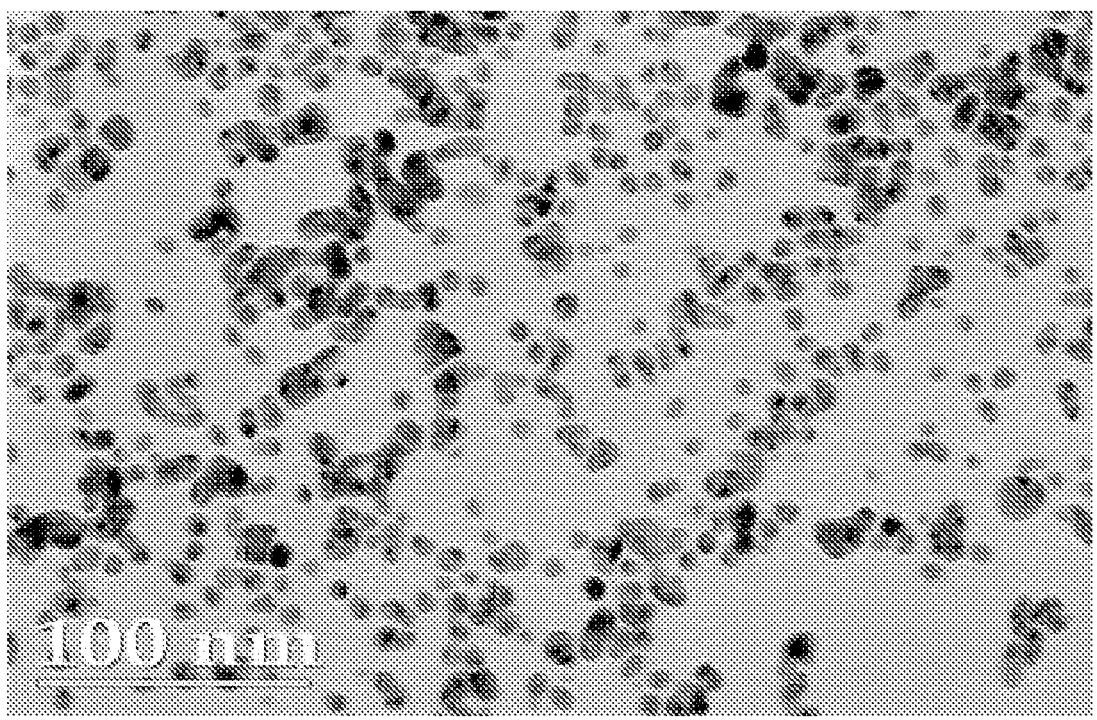
FIG. 1(A) depicts a transmission electron microscope ("TEM") micrograph of silver nanoparticles synthesized by the present invention.
Figure 1B:
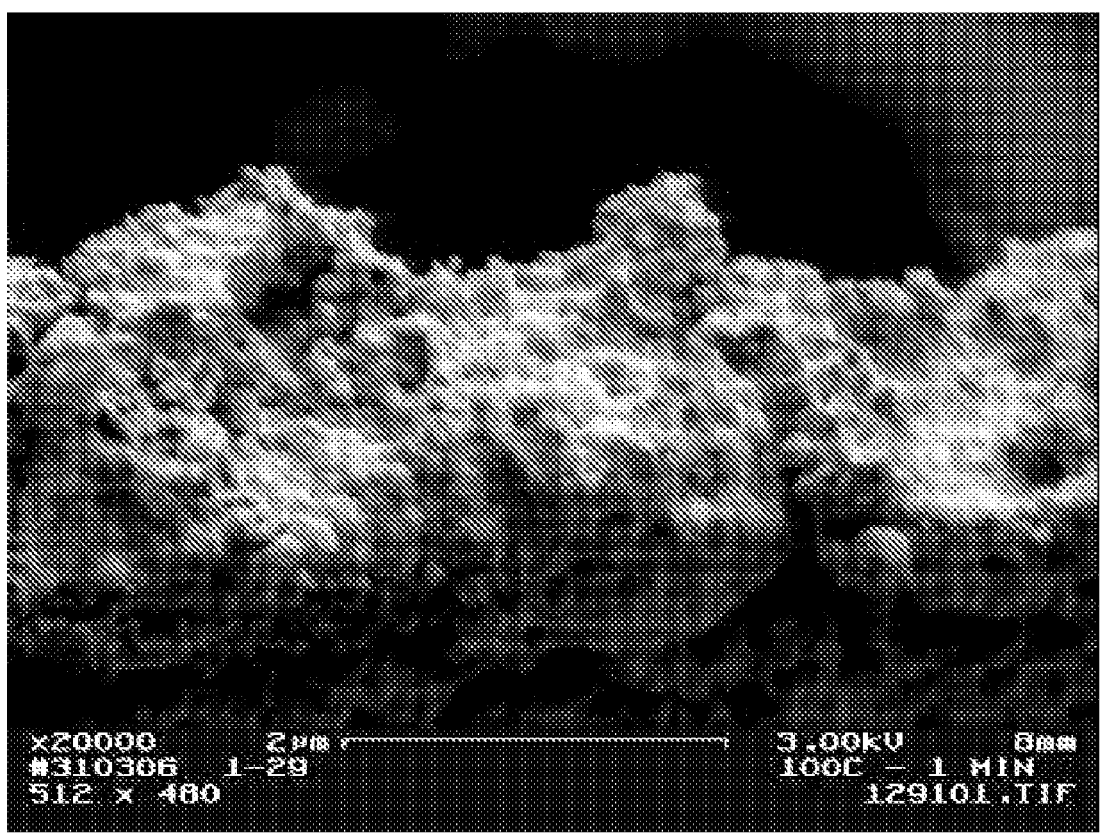
FIG. 1(B) illustrates a scanning electron microscope ("SEM") micrograph of a trace comprised of a composition of the present invention cured for 1 minute at 100° C.
Figure 1C:
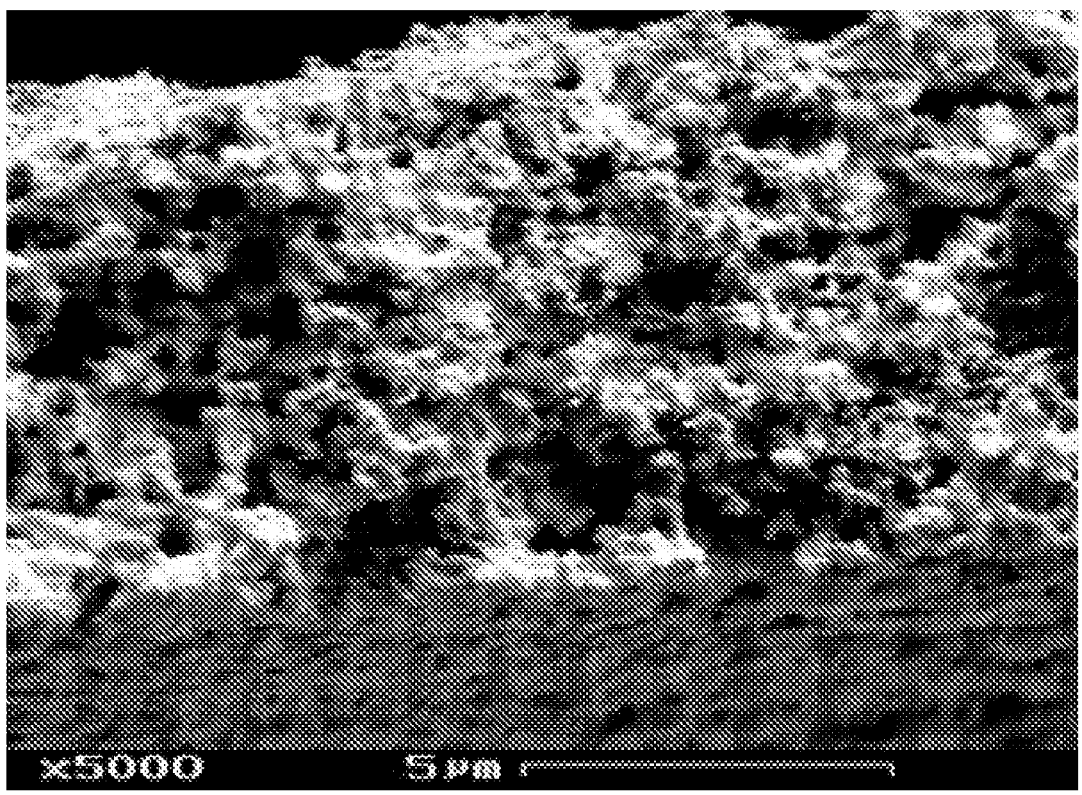
FIG. 1(C) depicts a SEM micrograph of a trace comprised of a composition of the present invention cured for 3 minutes at 85° C.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

Terms

As used herein, "mil" means $1/1000$ of an inch. 1 mil is also equivalent to 25.4 micrometers.

As used herein, "sheet resistance" means the electrical resistance divided by the number of squares.

As used herein, "square" means the length of a film or layer divided by the length of the film or layer.

As used herein, the term "mohms" refers to milli ohms, or $1/1000^{th}$ ohm.

As used herein, the term "aqueous" means containing water.

As used herein, the term "bonding" means covalently bonding, ionically bonding, hydrogen bonding, coordinate bonding, and the like.

As used herein, the term "tail" means a straight, branched, or cyclic chain of carbon atoms, wherein the chain may be aliphatic, and wherein the chain may have one or more additional groups bound to one or more of its member carbon atoms. An example would be a chain of aliphatic carbon atoms with an alcohol group attached to one of the chain members.

As used herein, the term "heteroatomic head group" means a group including at least one atom wherein at least one atom within the group is atom other than carbon. Examples include nitrogen, sulfur, or oxygen.

As used herein, the term "cohesive" means united as a single entity and resisting separation.

As used herein, the term "complexing" means forming coordinating bonds with a metal atom or ion.

As used herein, the term "ligand" means a molecule or a molecular group that binds to another chemical entity to form a larger complex. Examples include a molecular group that becomes bound to a metal or metal ion by a coordinate covalent bond through donating electrons from a lone electron pair of the ligand into an empty metal electron orbital.

As used herein, the term "agglomeration" means two or more particles reversibly clustered together, wherein the surfaces of the particles do not come into contact with one another.

As used herein, the term "floc" means two or more particles reversibly clustered together, wherein the surfaces of the particles do not come into contact with one another.

As used herein, the term "bulk resistivity" means the inherent resistivity of a material that makes up a specified object. For example, the bulk resistivity of a ingot made of silver would be the inherent conductivity of silver. As another example, the bulk resistivity of an ingot made of an alloy comprising silver and gold would be the inherent conductivity of the silver and gold alloy.

As used herein, the terms "aggregate", "aggregation", and similar forms mean a unified structure comprised of two or more particles irreversibly fused, connected, or necked together.

As used herein, "corresponding metal" means the metal or metals that comprise an object or objects.

Provided are cohesive metallic shielding structures, comprising: a population of metallic nanoparticles deposited on a substrate and sintered to form a cohesive metallic shielding structure, wherein the cohesive metallic shielding structure has a characteristic thickness of less than about 20 micrometers; and wherein the cohesive metallic shielding structure has a sheet resistance less than about 50 mohms/square/mil.

The cohesive metallic shielding structure suitably has a sheet resistance of at least about 1 mohms/square/mil. Suitably, at least one of the metallic nanoparticles comprises silver, copper, gold, zinc, cadmium, palladium, iridium, ruthenium, osmium, rhodium, platinum, aluminum, iron, nickel, cobalt, indium, silver oxide, copper oxide, gold oxide, zinc oxide, cadmium oxide, palladium oxide, iridium oxide, ruthenium oxide, osmium oxide, rhodium oxide, platinum oxide, iron oxide, nickel oxide, cobalt oxide, indium oxide, or any combination thereof. In some embodiments, at least one of the metallic nanoparticles comprises silver, copper, gold, nickel, aluminum, or any combination thereof.

The composition is capable of forming the cohesive metallic shielding structure following sintering at a temperature of less than about 140° C. In some embodiments, the composition is capable of forming the cohesive metallic shielding structure following sintering for less than about 90 seconds.

It is contemplated that the population of nanoparticles is characterized as having an average particle size, based on number, of less than about 100 nm. The population of nanoparticles can be characterized as having an average particle size, based on number, of less than about 50 nm.

The population of nanoparticles is suitably characterized in some embodiments as being substantially spherical.

The population of nanoparticles when sintered is characterized as being a continuous network film.

It is contemplated that the cohesive metallic shielding structure has a density less than the density of the bulk metal. Without limiting the scope of the invention, it is believed that the cohesive metallic shielding structure can have a density as low at 40% of the density of the corresponding bulk metal.

The cohesive metallic shielding structure can be characterized as being a continuous porous network of sintered nanoparticles.

Also disclosed are methods for forming a cohesive metallic shielding structure on a substrate. These methods comprise depositing a composition comprising a population of metallic nanoparticles dispersed in an aqueous medium onto the substrate, wherein at least a portion of the population of metallic nanoparticles comprise individual metallic nanoparticles characterized as having an average cross-sectional dimension in the range of from about 1 nm to about 100 nm; and wherein each of the nanoparticles comprise at least one ligand bound to its surface, the ligand comprising a heteroatom head group bound to the nanoparticle surface and a tail bound to the heteroatom head group; and curing the composition at a temperature of less than about 140° C. so as to give rise to a cohesive metallic shielding structure having a sheet resistance of less than about 50 mohms/square/mil.

Suitable deposition steps comprise coating a formulation comprising the metallic nanoparticles in an aqueous medium using one or more coating or printing methods.

Suitable printing methods include flexographic printing, rotogravure printing, lithographic printing, intaglio printing, relief printing, screen printing, inkjet printing, laser printing, or any combination thereof.

Suitable coating methods include spray coating, dip coating, spin coating, blade coating, or wire rod coating.

The nanoparticles can be deposited on a substrate to a thickness of less than about 150 microns, or to a thickness of less than about 50 microns, or to a thickness of less than about 20 microns. In some embodiments, the composition comprising at least one metallic nanoparticle in an aqueous medium is deposited to a thickness of less than about 10 microns, less than about 5 microns, less than about 3 microns, or even to a thickness of less than about 2 or less than about 1 microns.

The cohesive structure suitably has a thickness of less than about 50 micrometers. In some embodiments, the cohesive structure has a thickness of less than about 10 microns, or less than about 5 microns.

The methods can, in some cases, include one or more pre- or post-curing drying steps. Without limiting the invention to any particular mode of operation, it is believed that the additional drying steps enhance the formation of a continuous, conductive shielding network by removing any excess solvent or aqueous species.

The nanoparticle population of the methods further comprises particle agglomerate comprised of two or more individual nanoparticles, nanoparticle floc comprised of two or more individual nanoparticles, or any combination thereof.

It is contemplated that the ratio, by weight, of the population of individual metallic nanoparticles to particle agglomerate is in the range of from about 1:99 to 99:1. It is also contemplated that the ratio, by weight, of the population of individual metallic nanoparticles to particle floc is in the range of from about 1:99 to 99:1.

A nanoparticle agglomerate or floc can have an average cross-sectional dimension in the range of from about 100 nm to about 10,000 nm.

Individual metallic nanoparticles of the methods can include silver, copper, gold, zinc, cadmium, palladium, iridium, ruthenium, osmium, aluminum, rhodium, platinum, iron, nickel, cobalt, indium, silver oxide, copper oxide, gold oxide, zinc oxide, cadmium oxide, palladium oxide, iridium oxide, ruthenium oxide, osmium oxide, aluminum oxide, rhodium oxide, platinum oxide, iron oxide, nickel oxide, cobalt oxide, indium oxide, or any combination thereof.

Aqueous media contemplated by the methods are capable of solvating metallic salts in a range of from about 10 grams/liter to about 600 grams/liter.

Nanoparticles of the composition of the disclosed methods are present in the range of from about 0.5 wt % to about 70 wt %. Ligand can be present in the range of from about 0.5 wt % to about 75 wt %, and the medium is present in the range of from about 30 to about 98 wt %.

The composition is capable of forming a cohesive structure of less than about 10 μm in thickness following curing at a temperature of less than about 140° C. for less than about 60 seconds. In some embodiments, the cohesive shielding structure has a resistivity in the range of from about 2 times to about 15 times the bulk resistivity of the corresponding metal.

In some embodiments, the methods include depositing the composition onto a first substrate and curing the composition curing the composition at a temperature of less than about 140° C. so as to give rise to a cohesive metallic shielding structure having a sheet resistance of less than about 50 mohms/square/mil. These embodiments further include affixing the first substrate to a second substrate. Suitable ways of affixing include laminating, gluing, bonding, or any combination thereof. One or more pre- or post-cure drying steps can also be performed.

In other embodiments, the methods include affixing a first substrate to a second substrate, wherein the affixing comprises laminating, gluing, bonding, or any combination thereof. Affixing can be accomplished adhesively, cohesively, or electrostatically The first substrate can be affixed to a second substrate. Suitable means of affixing are described above.

These other embodiments further include depositing the composition onto the first substrate, onto the second substrate, or any combination thereof, and curing the composition curing the composition at a temperature of less than about 140° C. so as to give rise to a cohesive metallic shielding structure having a sheet resistance of less than about 50 mohms/square/mil. One or more pre- or post-cure drying steps may suitable be performed.

The composition of the disclosed methods can include adhesives, rheology modifiers, thickeners, or any combination thereof.

EXAMPLES

Example 1

An ink composition was prepared by adding 0.44 grams of a 25 wt. % polyvinyl alcohol solution (Aldrich 9,000-10,000 Mw) and 1.14 grams of an acrylic nanoparticle latex dispersion to 22.2 grams of 35 wt % silver nanoparticle dispersion. The materials were mixed well together and a film of the resulting ink was deposited onto 0.005 inch (5 mil) thick polyester film with a 0.0003 inch (0.3 mil) diameter wire wound rod and then cured at 130° C. for 30 seconds resulting in a cohesive and conductive silver film. The adhesion of the film to the substrate was evaluated by utilizing the tape test method previously described in Example 2. Some of the material was removed from the substrate was removed from the substrate Example 2

A composition comprising an aqueous suspension of silver nanoparticles (approximately 42 wt % silver) was mixed with 3 wt % polyvinyl alcohol (PVOH) solution (25 wt % PVOH). The samples were dried at 80° C. for 5-15 minutes. These samples exhibited sheet resistances of 30-45 mohms/sq at an estimated thickness of 1.5 microns. The normalized sheet resistance (per 25.4 microns or per 1 mil) was approximately 1.8 mohms/sq/mil.

TABLE 1

| A Material | B Wt % Ag | C Coverage sq m/kg | D Coverage sq m/kg @ 1 mil | E Sheet Resistance mohms/sq | F Thickness, micrometers (estimated) | G Sheet Resistance mohms/sq/mil |
|---|---|---|---|---|---|---|
| A1 | 41 | 55 | 6.50 | 129 | 3 | 7 |
| A2 | 41 | 31.7 | 6.24 | 57 | 5 | 5 |

TABLE 1-continued

| A Material | B Wt % Ag | C Coverage sq m/kg | D Coverage sq m/kg @ 1 mil | E Sheet Resistance mohms/sq | F Thickness, micrometers (estimated) | G Sheet Resistance mohms/sq/mil |
|---|---|---|---|---|---|---|
| Comparative Material 1 | 47 | 7.11 | 3.36 | 25 | 12 | 25 |
| Comparative Material 2 | 50.8 | 4.69 | 4.62 | 15 | 25 | 15 |

As is seen in Table 1, inventive materials A1 through A2 exhibit certain characteristics that differentiate them from tested existing materials Comparative Material 1 and 2.

First, the inventive materials are capable of covering, on a per-weight basis, a greater surface area of substrate than are the tested existing materials, as is seen in Columns C and D of Table 1.

Second, the inventive materials exhibit a higher sheet resistance than do the tested existing materials. This is shown in Column E of Table 1. As seen in Column F of Table 1, the inventive materials achieve such sheet resistance at lower thicknesses than do the tested comparative materials. As a result, the inventive materials present greater sheet resistance on a per-thickness basis than do the tested comparative materials, as shown in Column G of Table 1.

Accordingly, as shown in Table 1, the inventive materials are capable of providing a higher sheet resistance on a per-thickness and per-area basis than are the tested comparative materials. Because the inventive materials are capable of covering, on a per-weight basis, a greater surface area of substrate than are the tested existing materials, a given weight of the inventive materials provides greater shielding coverage for a given surface area of substrate than a greater weight of the tested comparative materials.

Example 3

To test the present invention's effectiveness for shielding, a formulation prepared according to the disclosed methods was sprayed onto the surface of polyester film and cured at 130° C. for 1 minute. The silver coating was estimated to be 1.5 mμ thick, and the sheet resistivity was measured to be 0.080 Ω/square at the coating thickness of 1.5 mμ. A bag, 10 cm by 15 cm, was fashioned by folding over silver coated polyester film having metal on the inside. Opposing surfaces adjacent to the fold were heat sealed together. A cell phone was then placed inside bag, and the bag was completely sealed.

Before placing the cell phone in the bag, the cell phone signal strength was 4 bars, according to the cell phone's signal strength meter. The silver coating thickness was thin enough to allow the cell phone display to be seen through the metal/substrate matrix.

After placing the cell phone in the bag, the bag was completely sealed. Upon sealing the bag, the cell phone signal strength showed zero bars. An attempt was then made to call the cell phone, but no connection was made. When one end of the bag was reopened, the cell phone signal strength returned to 4 bars, and calling the cell phone resulted in a connection.

Example 4

To further test the shielding effectiveness of the disclosed formulations, a procedure similar to that of Example 3 was followed. A formulation made according to the disclosed methods was sprayed onto a polyester film and cured at 130° C. for 1 minute. The silver coating was estimated to be 0.5 mμ thick, and the sheet resistivity was measured to be 0.30 Ω/square at the coating thickness of 0.5 mμ. A bag, 10 cm×15 cm, was fashioned by folding silver coated polyester film with the metal on the inside. The opposite surfaces adjacent to the fold were heat sealed together. A cell phone was placed inside bag, and the bag was completely sealed.

Prior to placing the cell phone in the bag, the cell phone signal strength was noted to be 4 bars. The silver coating thickness was thin enough to allow the cell phone display to be seen through the metal/substrate matrix.

After placing the cell phone in the bag, the bag was completely sealed. Upon sealing the bag, the cell phone's signal strength meter showed one bar of signal strength. An attempt was made to call the cell phone, and a connection was made. One end of the bag was opened and the cell phone signal strength returned to 4 bars. Calling the cell phone resulted in a connection. While the bag fabricated according to Example 4 effectively reduced the signal to the cell phone, it did not completely stop the signal.

What is claimed:

1. A cohesive metallic shielding structure, comprising:
   a population of metallic nanoparticles, deposited on a substrate and sintered to form a cohesive metallic shielding structure,
   wherein the cohesive metallic shielding structure has a characteristic thickness of less than about 20 micrometers; and
   wherein the cohesive metallic shielding structure has a sheet resistance less than about 50 mohms/square/mil.

2. The cohesive metallic shielding structure of claim 1, wherein the sheet resistance is at least about 1 mohms/square/mil.

3. The cohesive metallic shielding structure of claim 1, wherein at least one of the metallic nanoparticles comprises silver, copper, gold, zinc, cadmium, palladium, iridium, ruthenium, osmium, rhodium, platinum, aluminum, iron, nickel, cobalt, indium, silver oxide, copper oxide, gold oxide, zinc oxide, cadmium oxide, palladium oxide, iridium oxide, ruthenium oxide, osmium oxide, rhodium oxide, platinum oxide, iron oxide, nickel oxide, cobalt oxide, indium oxide, or any combination thereof.

4. The cohesive metallic shielding structure of claim 1, wherein at least one of the metallic nanoparticles comprises silver, copper, gold, nickel, aluminum, or any combination thereof.

5. The cohesive metallic shielding structure of claim 1, wherein the composition is capable of forming the cohesive metallic shielding structure by sintering at a temperature of less than about 140° C.

6. The cohesive metallic shielding structure of claim 1, wherein the composition is capable of forming the cohesive metallic shielding structure by sintering for less than about 90 seconds.

7. The cohesive metallic shielding structure of claim 1, wherein the population of nanoparticles is characterized as having an average particle size, based on number, of less than about 100 nm.

8. The cohesive metallic shielding structure of claim 1, wherein the population of nanoparticles is characterized as having an average particle size, based on number, of less than about 50 nm.

9. The cohesive metallic shielding structure of claim 1, wherein the population of nanoparticles is sintered.

10. The composition of claim 9, wherein the sintered nanoparticles are characterized as being a continuous network film.

11. The cohesive metallic shielding structure of claim 1, wherein the nanoparticles are characterized as being substantially spherical.

12. The cohesive metallic shielding structure of claim 1, wherein the density of the cohesive metallic shielding structure is less than the density of a bulk metal consisting essentially of the metallic portion of the nanoparticles.

13. The cohesive metallic shielding structure of claim 12, wherein the density of the cohesive metallic shielding structure is less than the bulk density of silver.

14. The cohesive metallic shielding structure of claim 1, wherein the cohesive metallic shielding structure is characterized has being a continuous porous network of sintered nanoparticles.

15. A method of forming a cohesive metallic shielding structure on a substrate, comprising:
   depositing a composition comprising a population of metallic nanoparticles dispersed in an aqueous medium onto the substrate, wherein at least a portion of the population of metallic nanoparticles comprise individual metallic nanoparticles characterized as having an average cross-sectional dimension in the range of from about 1 nm to about 100 nm; and wherein at least one nanoparticle comprises at least one ligand bound to its surface, the ligand comprising a heteroatom head group bound to the nanoparticle surface and a tail bound to the heteroatom head group; and
   curing the composition at a temperature of less than about 140° C. so as to give rise to a cohesive metallic shielding structure having a sheet resistance of less than about 50 mohms/square/mil.

16. The method of claim 15, wherein the depositing step comprises coating a formulation comprising the metallic nanoparticles in an aqueous medium using one or more coating or printing methods.

17. The method of claim 16, wherein the printing methods comprise flexographic printing, rotogravure printing, lithographic printing, intaglio printing, relief printing, screen printing, inkjet printing, laser printing, or any combination thereof.

18. The method of claim 16, wherein the coating methods comprise spray coating, dip coating, spin coating, blade coating, wire rod coating, or any combination thereof.

19. The method of claim 15, wherein the composition comprising at least one metallic nanoparticle in an aqueous medium is deposited to a thickness of less than about 150 microns.

20. The method of claim 15, wherein the composition comprising at least one metallic nanoparticle in an aqueous medium is deposited to a thickness of less than about 50 microns.

21. The method of claim 15, wherein the composition comprising at least one metallic nanoparticle in an aqueous medium is deposited to a thickness of less than about 20 microns.

22. The method of claim 15, wherein the composition comprising at least one metallic nanoparticle in an aqueous medium is deposited to a thickness of less than about 10 microns.

23. The method of claim 15, wherein the composition comprising at least one metallic nanoparticle in an aqueous medium is deposited to a thickness of less than about 5 microns.

24. The method of claim 15, wherein the composition comprising at least one metallic nanoparticle in an aqueous medium is deposited to a thickness of less than about 3 microns.

25. The method of claim 15, wherein the composition comprising at least one metallic nanoparticle in an aqueous medium is deposited to a thickness of less than about 2 microns.

26. The method of claim 15, wherein the composition comprising at least one metallic nanoparticle in an aqueous medium is deposited to a thickness of less than about 1 microns.

27. The method of claim 15, wherein the cohesive structure has a thickness of less than about 50 micrometers.

28. The method of claim 15, further comprising one or more pre- or post-curing drying steps.

29. The method of claim 15, wherein the nanoparticle population further comprises particle agglomerate comprised of two or more individual nanoparticles, nanoparticle floc comprised of two or more individual nanoparticles, or any combination thereof.

30. The method of claim 29, wherein the ratio, by weight, of the population of individual metallic nanoparticles to particle agglomerate is in the range of from about 1:99 to 99:1.

31. The method of claim 29, wherein the ratio, by weight, of the population of individual metallic nanoparticles to particle floc is in the range of from about 1:99 to 99:1.

32. The method of claim 29, a nanoparticle agglomerate has an average cross-sectional dimension in the range of from about 100 nm to about 10000 nm.

33. The method of claim 29, wherein a nanoparticle floc has an average cross-sectional dimension in the range of from about 100 to about 10000 nm.

34. The method of claim 15, wherein an individual metallic nanoparticle comprises silver, copper, gold, zinc, cadmium, palladium, iridium, ruthenium, osmium, aluminum, rhodium, platinum, iron, nickel, cobalt, indium, silver oxide, copper oxide, gold oxide, zinc oxide, cadmium oxide, palladium oxide, iridium oxide, ruthenium oxide, osmium oxide, aluminum oxide, rhodium oxide, platinum oxide, iron oxide, nickel oxide, cobalt oxide, indium oxide, or any combination thereof.

35. The method of claim 15, wherein the aqueous medium is capable of solvating a metallic salt in a range of from about 10 grams/liter to about 600 grams/liter.

36. The method of claim 15, wherein the nanoparticles are present in the range of from about 0.5 wt % to about 70 wt %.

37. The method of claim 15, wherein the ligand is present in the range of from about 0.5 wt % to about 75 wt %.

38. The method of claim 15, wherein the medium is present in the range of from about 30 to about 98 wt %.

39. The method of claim 15, wherein the composition is capable of forming a cohesive structure of less than about 10 μm in thickness following curing at a temperature of less than about 140° C. for less than about 60 seconds.

40. The method of claim 39, wherein the cohesive structure has a resistivity in the range of from about 2 times to about 15 times the bulk resistivity of the corresponding metal.

41. The method of claim 15, comprising depositing the composition onto a first substrate and curing the composition at a temperature of less than about 140° C. so as to give rise to a cohesive metallic shielding structure having a sheet resistance of less than about 50 mohms/square/mil.

42. The method of claim 41, further comprising affixing the first substrate to a second substrate, wherein the affixing comprises laminating, gluing, bonding, or any combination thereof.

43. The method of claim 41, further comprising one or more pre- or post-cure drying steps.

44. The method of claim 15, comprising affixing a first substrate to a second substrate, wherein the affixing comprises laminating, gluing, bonding, or any combination thereof.

45. The method of claim 44, further comprising depositing the composition onto the first, onto the second substrate, or any combination thereof.

46. The method of claim 44, further comprising one or more pre- or post-cure drying steps.

47. The method of claim 15, wherein the composition further comprises adhesives, rheology modifiers, thickeners, or any combination thereof.

48. A device, comprising:
a population of metallic nanoparticles deposited on a substrate and sintered to form a cohesive metallic shielding structure, the cohesive metallic shielding structure characterized as having a thickness of less than about 20 micrometers and a sheet resistance less than about 50 mohms/square/mil.

49. A method comprising shielding electromagnetic radiation using the device of claim 48.

50. The method of claim 15, wherein the curing is effected under an essentially ambient atmosphere.

* * * * *